United States Patent
Takeuchi et al.

(10) Patent No.: US 10,340,887 B2
(45) Date of Patent: Jul. 2, 2019

(54) BAND PASS FILTER AND FILTER MODULE

(71) Applicant: Murata Manufacturing Co., Ltd., Nagaokakyo-shi, Kyoto-fu (JP)

(72) Inventors: Morio Takeuchi, Nagaokakyo (JP); Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 186 days.

(21) Appl. No.: 15/409,696

(22) Filed: Jan. 19, 2017

(65) Prior Publication Data

US 2017/0134005 A1    May 11, 2017

Related U.S. Application Data

(63) Continuation of application No. PCT/JP2015/071117, filed on Jul. 24, 2015.

(30) Foreign Application Priority Data

Jul. 25, 2014 (JP) .................. 2014-151345
Oct. 23, 2014 (JP) .................. 2014-215999

(51) Int. Cl.
*H03H 9/54* (2006.01)
*H03H 9/64* (2006.01)
(Continued)

(52) U.S. Cl.
CPC .......... *H03H 9/542* (2013.01); *H03H 7/1758* (2013.01); *H03H 7/1766* (2013.01);
(Continued)

(58) Field of Classification Search
CPC .... H03H 9/542; H03H 7/1766; H03H 9/6483; H03H 9/605; H03H 9/6406; H03H 7/1758; H04W 88/06
(Continued)

(56) References Cited

U.S. PATENT DOCUMENTS

| 2006/0028298 A1 | 2/2006 | Nakamura et al. |
| 2010/0164646 A1 | 7/2010 | Nakanishi et al. |
| 2013/0147578 A1* | 6/2013 | Hara ..................... H03H 9/605 333/133 |

FOREIGN PATENT DOCUMENTS

| JP | 07-283688 A | 10/1995 |
| JP | 09-098056 A | 4/1997 |

(Continued)

OTHER PUBLICATIONS

Machine English Translation of JPH0998056A Published on Apr. 8, 1997 (Year: 1997).*

(Continued)

*Primary Examiner* — Robert J Pascal
*Assistant Examiner* — Jorge L Salazar, Jr.
(74) *Attorney, Agent, or Firm* — Keating & Bennett, LLP

(57) ABSTRACT

In a band pass filter, a first elastic wave resonator includes a first base board type and a first electrode configuration significantly improved or optimal for frequency characteristics of the first elastic wave resonator, and a second elastic wave resonator includes a second base board type and a second electrode configuration significantly improved or optimal for frequency characteristics of the second elastic wave resonator. A first attenuation pole provided by the first elastic wave resonator and a second attenuation pole provided by the second elastic wave resonator is steeper than if the first elastic wave resonator and the second elastic wave resonator that have different frequency characteristics include electrodes having the same configuration on the same types of base boards.

20 Claims, 8 Drawing Sheets

(51) Int. Cl.
  *H03H 7/01* (2006.01)
  *H03H 9/60* (2006.01)
  *H04W 88/06* (2009.01)

(52) U.S. Cl.
  CPC .......... *H03H 9/605* (2013.01); *H03H 9/6406* (2013.01); *H03H 9/6483* (2013.01); *H04W 88/06* (2013.01)

(58) Field of Classification Search
  USPC .................... 333/133, 187, 188, 193–196
  See application file for complete search history.

(56) References Cited

FOREIGN PATENT DOCUMENTS

| | | |
|---|---|---|
| JP | 09-181549 A | 7/1997 |
| JP | 2002-319836 A | 10/2002 |
| JP | 2006-074749 A | 3/2006 |
| JP | 2008-078981 A | 4/2008 |
| WO | 2007/023643 A1 | 3/2007 |
| WO | 2013/128636 A1 | 9/2013 |

OTHER PUBLICATIONS

Machine English Translation of WO2013128636 A1 Published on Sep. 6, 2013 (Year: 2013).*
Machine English Translation of JPH07283688A Published on Oct. 27, 1995 (Year: 1995).*
Official Communication issued in corresponding International Application PCT/JP2015/071117, dated Sep. 1, 2015.

\* cited by examiner

BAND PASS FILTER AND FILTER MODULE

CROSS REFERENCE TO RELATED APPLICATIONS

This application claims the benefit of priority to Japanese Patent Application No. 2014-215999 filed on Oct. 23, 2014 and Japanese Patent Application No. 2014-151345 filed on Jul. 25, 2014, and is a Continuation Application of PCT Application No. PCT/JP2015/071117 filed on Jul. 24, 2015. The entire contents of each application are hereby incorporated herein by reference.

BACKGROUND OF THE INVENTION

1. Field of the Invention

The present invention relates to a band pass filter in which a predetermined pass band is set and to a filter module including such a filter.

2. Description of the Related Art

In recent years, multi-mode- and multi-band-compliant communication terminals have been provided. Such communication terminals include a band pass filter that allows only a desired communication signal to pass therethrough. For example, as illustrated in FIG. 11, a band pass filter 500 formed by connecting a concentrated-constant LC high pass filter 501 and a concentrated-constant LC low pass filter 502 in series has been proposed (see Japanese Unexamined Patent Application Publication No. 9-181549 (paragraphs [0008] and [0009], FIGS. 1 and 2, abstract, etc.), for example). Specifically, the LC high pass filter 501 is constituted of two capacitors C51 and C52 connected in series in a path W51 connecting an input terminal A51 to an output terminal B51, and an inductor L51 connected between a ground potential and a path between the capacitor C51 and the capacitor C52. Meanwhile, the LC low pass filter 502 is constituted of a single inductor L52 connected in series in the path W51, and two capacitors C55 and C56, each connected between the ground potential and the path W51 at respective ends of the inductor L52.

The band pass filter 500 is formed by the LC high pass filter 501 and the LC low pass filter 502 being connected in series and a predetermined pass band being set. This makes it possible to achieve a wider band for the pass band of the band pass filter 500. Furthermore, circuit constants of the band pass filter 500 can be adjusted by adding a capacitor C53 in series to the inductor L51 of the LC high pass filter 501 and adding a capacitor C54 in parallel to the inductor L52 of the LC low pass filter 502, which makes it possible to set the pass band characteristics of the band pass filter 500 as desired.

In multi-mode- and multi-band-compliant communication terminals, communication is carried out by selectively using a plurality of communication signals, each having a different frequency band. There is a recent trend toward the frequency bands assigned to the respective communication signals being close to each other, and thus there is demand for a band pass filter having steeper attenuation characteristics.

SUMMARY OF THE INVENTION

Preferred embodiments of the present invention provide band pass filters having improved attenuation characteristics and filter modules including such band pass filters.

A band pass filter according to a preferred embodiment of the present invention is a band pass filter, in which a predetermined pass band is set, the band pass filter including an LC filter including an inductor and a capacitor, a first elastic wave resonator having a resonant frequency and an anti-resonant frequency, and a second elastic wave resonator having a resonant frequency and an anti-resonant frequency. At least one of the resonant frequency and the anti-resonant frequency of the first elastic wave resonator is a first attenuation pole located within a first stop band on a low-frequency side of the pass band; at least one of the resonant frequency and the anti-resonant frequency of the second elastic wave resonator is a second attenuation pole located within a second stop band on a high-frequency side of the pass band; the first elastic wave resonator includes a first electrode and a piezoelectric first base board in or on which the first electrode is provided; the second elastic wave resonator includes a second electrode and a piezoelectric second base board in or on which the second electrode is provided; and a type of the first base board and a type of the second base board are different from each other, and/or a configuration of the first electrode and a configuration of the second electrode are different from each other.

According to a preferred embodiment of the present invention configured in this manner, attenuation characteristics on a low-frequency side of the band pass filter are able to be set more steeply, and attenuation characteristics on a high-frequency side of the band pass filter are able to be set more steeply.

Additionally, the first elastic wave resonator is able to be provided with the type of the first base board and the configuration of the first electrode that are significantly improved or optimal for the frequency characteristics of the first elastic wave resonator, and the second elastic wave resonator is able to be provided with the type of the second base board and the configuration of the second electrode that are significantly improved or optimal for the frequency characteristics of the second elastic wave resonator. Accordingly, a first attenuation pole provided by the first elastic wave resonator and a second attenuation pole provided by the second elastic wave resonator is able to be steeper than in a case where the first elastic wave resonator and the second elastic wave resonator that have different frequency characteristics are defined by electrodes having the same configuration on the same types of base boards. This makes it possible to provide a band pass filter having further improved attenuation characteristics.

It is preferable that the first base board and the second base board have mutually-different materials or electromechanical coupling coefficients, or the first electrode and the second electrode have mutually-different shapes.

Additionally, it is preferable that an LC high pass filter including the first stop band includes the first elastic wave resonator, a first inductor included in the inductor of the LC filter, and a first capacitor included in the capacitor of the LC filter; an LC low pass filter including the second stop band includes the second elastic wave resonator, a second inductor included in the inductor of the LC filter, and a second capacitor included in the capacitor of the LC filter; attenuation characteristics on a low-frequency side of the first attenuation pole of the first stop band are set by the first inductor and the first capacitor; attenuation characteristics on a high-frequency side of the second attenuation pole of the second stop band are set by the second inductor and the second capacitor; and the LC high pass filter and the LC low pass filter are connected in series.

According to this configuration, the pass band of the band pass filter has a wider band. Additionally, the first attenuation pole is provided by the first elastic wave resonator of the LC high pass filter in the first stop band on the low-frequency side of the pass band, and thus the attenuation characteristics near the border between the first stop band and the pass band are able to be improved. Furthermore, the attenuation characteristics on the low-frequency side of the first attenuation pole are set by the first inductor and the first capacitor of the LC high pass filter, and thus degradation of the attenuation characteristics on the low-frequency side of the first attenuation pole is significantly reduced or prevented.

Additionally, the second attenuation pole is provided by the second elastic wave resonator of the LC low pass filter in the second stop band on the high-frequency side of the pass band, and thus the attenuation characteristics near the border between the second stop band and the pass band are able to be improved. The attenuation characteristics on the high-frequency side of the second attenuation pole are set by the second inductor and the second capacitor of the LC low pass filter, and thus degradation of the attenuation characteristics on the high-frequency side of the second attenuation pole is significantly reduced or prevented.

Additionally, it is preferable that the LC high pass filter include a first input terminal, a first output terminal, and a plurality of the first capacitors connected in series in a first path connecting the first input terminal and the first output terminal, and at least one of the first inductors connected between the first path and a ground potential. It is preferable that at least one of the first capacitors be provided by capacitance of the first elastic wave resonator on a lower-band side of the resonant frequency of the first elastic wave resonator and a higher-band side of the anti-resonant frequency of the first elastic wave resonator.

Additionally, it is preferable that the LC low pass filter include a second input terminal, a second output terminal, and a plurality of the second inductors connected in series in a second path connecting the second input terminal and the second output terminal, and at least one of the second capacitors connected between the second path and a ground potential. It is preferable that at least one of the second capacitors be provided by capacitance of the second elastic wave resonator on a lower-band side of the resonant frequency of the second elastic wave resonator and a higher-band side of the anti-resonant frequency of the second elastic wave resonator.

Additionally, it is preferable that the band pass filter further include an input terminal, an output terminal, and a plurality of third capacitors connected in series in a path connecting the input terminal and the output terminal, and an LC parallel resonance circuit connected between the path and a ground potential. It is preferable that at least one of the third capacitors be provided by capacitance of the first elastic wave resonator, or at least one of resonance circuit capacitors that define the LC parallel resonance circuit be provided by capacitance of the first elastic wave resonator or the second elastic wave resonator.

Additionally, the band pass filter may further include an input terminal, an output terminal, a plurality of first elastic wave resonators connected in series in a path connecting the input terminal and the output terminal, and a plurality of second elastic wave resonators connected between the path and a ground potential.

According to this configuration, a band pass filter having favorable attenuation characteristics is able to be provided.

Additionally, it is preferable that the first elastic wave resonator and the second elastic wave resonator not be connected in series in the path.

By doing so, the second elastic wave resonator is not disposed in the path connecting the input terminal and the output terminal, and thus insertion loss in the pass band is able to be reduced.

Additionally, it is preferable that the anti-resonant frequency of the plurality of first elastic wave resonators connected in series in the path connecting the input terminal and the output terminal be the first attenuation pole, and that the resonant frequency of the plurality of second elastic wave resonators connected between the path and the ground potential be the second attenuation pole.

According to this configuration, attenuation characteristics on the low-frequency side of the band pass filter are able to be set more steeply, and attenuation characteristics on the high-frequency side of the band pass filter are able to be set more steeply.

Additionally, the first elastic wave resonator may be a SAW resonator and the second elastic wave resonator may be a piezoelectric thin film resonator or an SMR-type BAW resonator.

Additionally, the first elastic wave resonator may be a SAW resonator, the second elastic wave resonator may be a SAW resonator, the first base board may be a lithium tantalate piezoelectric substrate, and the second base board may be a lithium niobate piezoelectric substrate.

Additionally, the first elastic wave resonator may be a SAW resonator, the second elastic wave resonator may be a SAW resonator, and cut-angles of the first base board may differ from cut-angles of the second base board.

Additionally, the first elastic wave resonator may be a SAW resonator, the second elastic wave resonator may be a SAW resonator, and an electrode structure of the SAW resonator defining the first elastic wave resonator may differ from an electrode structure of the SAW resonator defining the second elastic wave resonator.

Additionally, the first elastic wave resonator may be a SAW resonator, the second elastic wave resonator may be a SAW resonator, and an electrode film thickness of the SAW resonator defining the first elastic wave resonator may differ from an electrode film thickness of the SAW resonator defining the second elastic wave resonator.

Additionally, a filter module according to a preferred embodiment of the present invention includes a module board to mount the first base board and the second base board.

According to a preferred embodiment of the present invention configured in this manner, a filter module including a band pass filter that improves attenuation characteristics is provided.

According to various preferred embodiments of the present invention, the first elastic wave resonator is provided with the significantly improved or optimal material or electromechanical coupling coefficient of the first base board and significantly improved or optimal shapes of the first electrodes for the frequency characteristics of the first elastic wave resonator, and the second elastic wave resonator is provided with the significantly improved or optimal material or electromechanical coupling coefficient of the second base board and significantly improved or optimal shapes of the second electrodes for the frequency characteristics of the second elastic wave resonator. Accordingly, the first attenuation pole provided by the first elastic wave resonator and the second attenuation pole provided by the second elastic wave resonator are steeper than in a case where the first elastic wave resonator and the second elastic wave resonator that have different frequency characteristics are provided with electrodes having the same shape on base boards of the same materials or electromechanical coupling coefficients. This makes it possible to provide a band pass filter that improves the attenuation characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A filter module according to a first preferred embodiment of the present invention will be described with reference to FIGS. 1 to 6.

Figure 1:
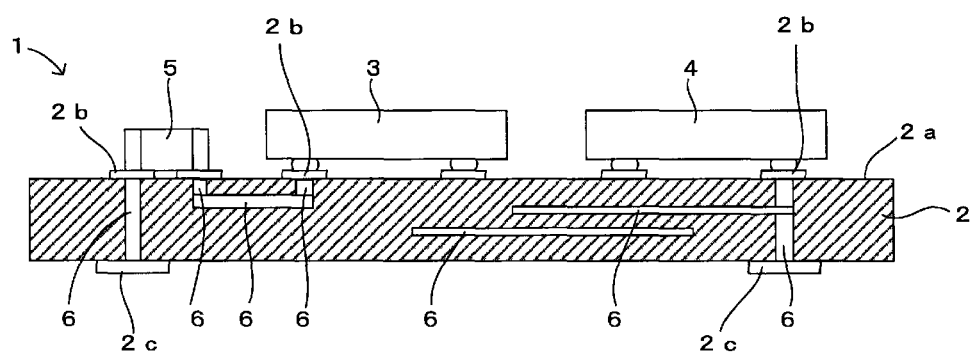
FIG. 1 is a diagram illustrating a filter module according to a first preferred embodiment of the present invention.
Figure 2:
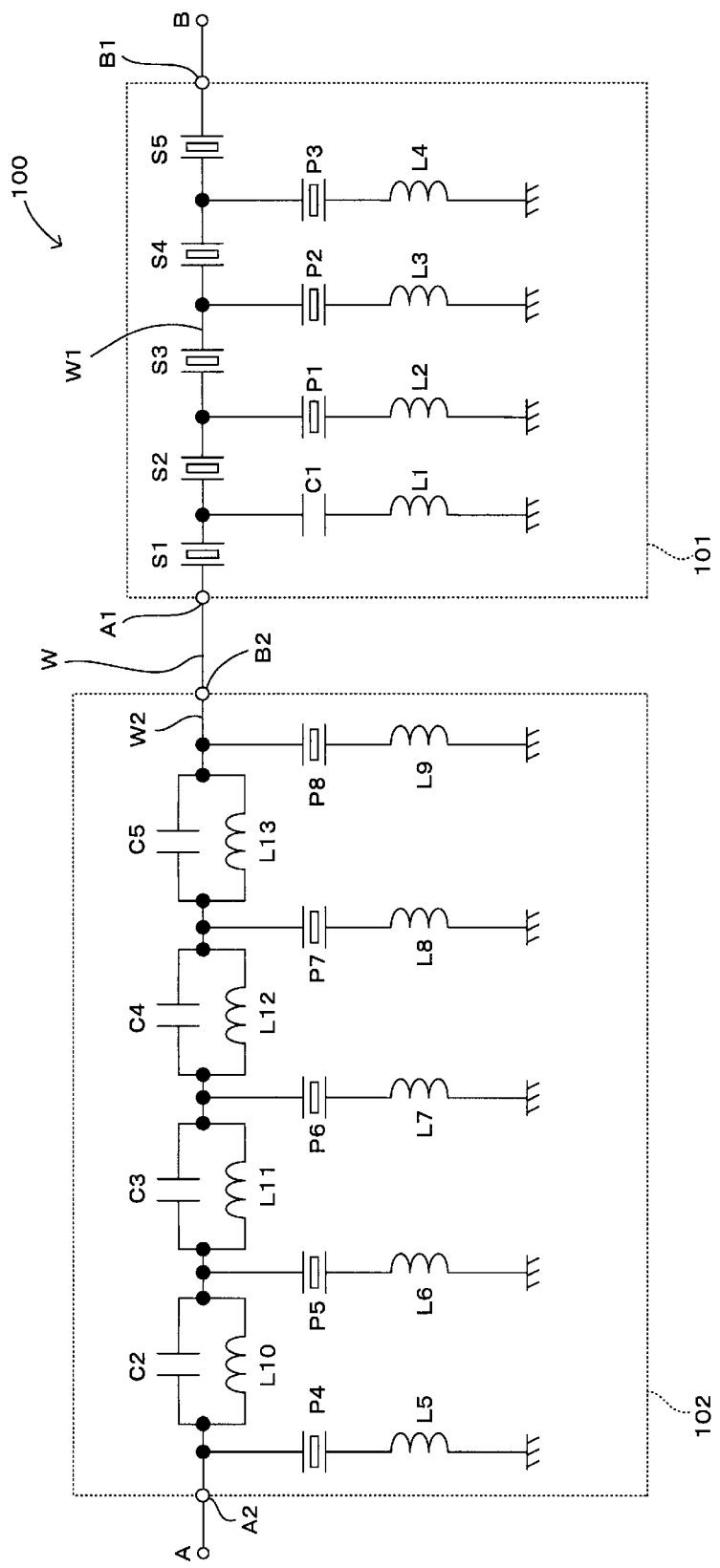
FIG. 2 is a circuit diagram illustrating a band pass filter included in the filter module illustrated in FIG. 1.

Note that FIGS. 1 and 2 illustrate only the primary configuration of a preferred embodiment of the present invention, and other configurations are not shown in order to simplify the descriptions. Additionally, like FIGS. 1 and 2, the drawings referred to in later descriptions illustrate only the primary configurations, and descriptions thereof will be omitted hereinafter.

A filter module 1 illustrated in FIGS. 1 and 2 is preferably a front end module disposed immediately subsequent to an antenna element provided in a mobile communication terminal such as a cellular phone, a mobile information terminal, or the like, and includes a band pass filter 100 illustrated in FIG. 2. In this preferred embodiment, the filter module 1 includes a module board 2, first and second base boards 3 and 4, and various circuit components 5 such as inductors and capacitors. The first and second base boards 3 and 4 and the various circuit components 5 are mounted on mounting electrodes 2b provided on a mounting surface 2a of the module board 2, and are electrically connected, by wiring electrodes 6 provided in the module board 2, to a plurality of mounting electrodes 2c provided on a rear surface of the module board 2. Note that first electrodes (not illustrated) defining a first elastic wave resonator are provided on the first base board 3 and second electrodes defining a second elastic wave resonator are provided on the second base board 4; these will be described in detail later.

The module board 2 is formed preferably by laminating a plurality of dielectric layers. The wiring electrodes 6, mounting electrodes 2c, and so on, that electrically connect the first and second base boards 3 and 4, the circuit components 5, and so on mounted on the module board 2 are defined by via conductors and in-plane conductor patterns provided on each dielectric layer, and the band pass filter 100 is provided by electrically connecting those elements together. Note that the band pass filter 100 may be provided by electrically connecting circuit elements such as capacitors and inductors defined by the in-plane conductor patterns and the via conductors provided in each dielectric layer to the first and second base boards 3 and 4, the various circuit components 5, and so on.

Figure 3:
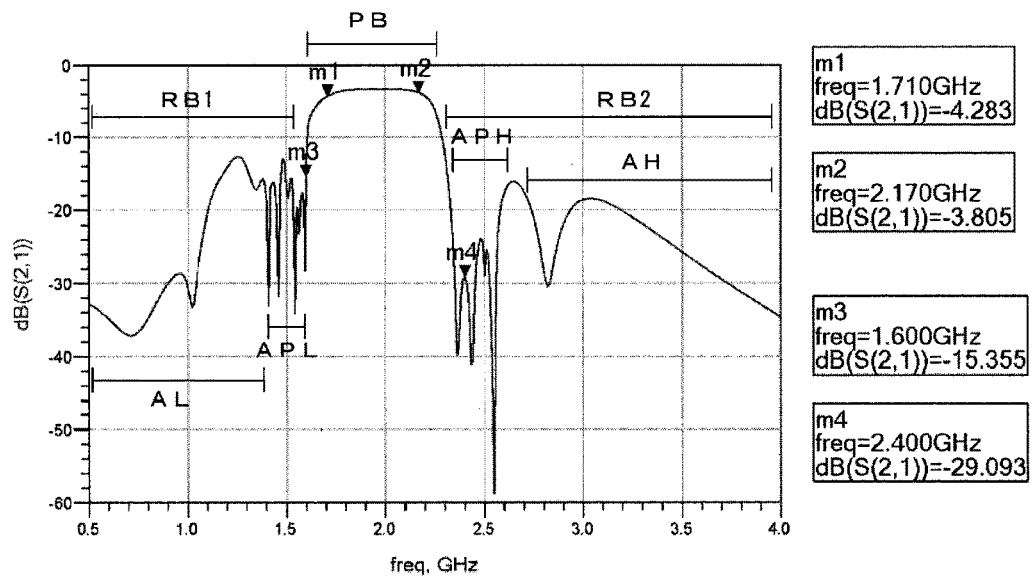
FIG. 3 is a diagram illustrating bandpass characteristics of the band pass filter illustrated in FIG. 2.

In this preferred embodiment, a predetermined pass band PB is set for the band pass filter 100, as illustrated in FIG. 3. As illustrated in FIG. 2, the band pass filter 100 includes an LC high pass filter 101 for which a first stop band RB1 on the low-frequency side of the pass band PB is set and an LC low pass filter 102 for which a second stop band RB2 on the high-frequency side of the pass band PB is set, the LC high pass filter 101 and the LC low pass filter 102 connected in series in a path W connecting an input terminal A and an output terminal B. The band pass filter 100, in which the pass band PB, the first stop band RB1, and the second stop band RB2 are set, is provided by connecting the LC high pass filter 101 and the LC low pass filter 102 in series.

The LC high pass filter 101 includes a first input terminal A1 connected to a second output terminal B2 of the LC low pass filter 102, a first output terminal B1 connected to the output terminal B of the band pass filter 100, a plurality of first elastic wave resonators S1-S5 and P1-P5 defined by the first electrodes provided on or in the first base board 3, a plurality of first inductors L1-L4, and an attenuation characteristic adjustment capacitor C1. Five of the first elastic wave resonators S1-S5 are connected in series in a first path W1 connecting the first input terminal A1 and the first output terminal B1. The plurality of first inductors L1-L4 are connected between two of the first elastic wave resonators connected in series, between the first path W1 and a ground potential.

The first elastic wave resonator P1 is connected in series between the first inductor L2 of the first inductors and a path connecting the first elastic wave resonators S2 and S3. The first elastic wave resonator P2 is connected in series between the first inductor L3 and a path connecting the first elastic wave resonators S3 and S4. The first elastic wave resonator P3 is connected in series between the first inductor L4 and a path connecting the first elastic wave resonators S4 and S5. The attenuation characteristic adjustment capacitor C1 is connected in series between the first inductor L1 and a path connecting the first elastic wave resonators S1 and S2. Note that each first elastic wave resonator preferably has at least one of a resonant frequency and an anti-resonant frequency in a band APL near the border between the first stop band RB1 and the pass band PB, as illustrated in FIG. 3. By setting the resonant frequency or anti-resonant frequency of each of the plurality of first elastic wave resonators to a different value, a first attenuation pole group is able to be provided in the band APL, as illustrated in FIG. 3. Providing the first attenuation pole group in this manner makes it possible to provide a band having desired attenuation characteristics in the first stop band RB1 near the pass band PB.

Figure 4:
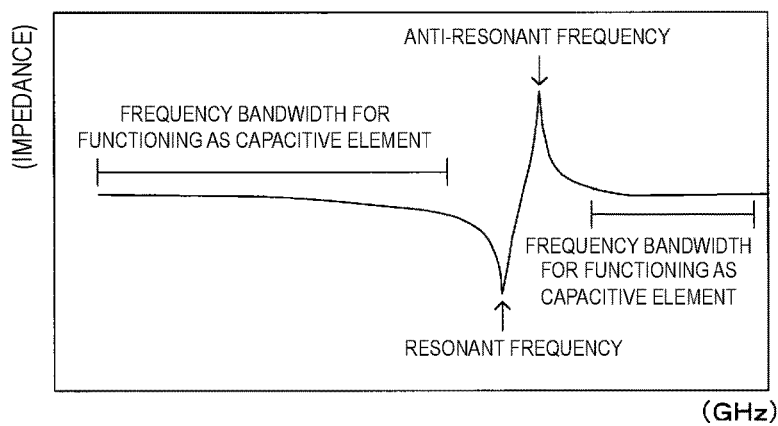
FIG. 4 is a diagram illustrating frequency characteristics of an elastic wave resonator.

Meanwhile, as illustrated in FIG. 4, the first elastic wave resonators define and function as capacitive elements in bands on the low-frequency side of the resonant frequencies thereof. As such, attenuation characteristics of a high-frequency signal in a band AL on the low-frequency side of the first attenuation pole group are set by the first inductors, the attenuation characteristic adjustment capacitor C1, and the first elastic wave resonators defining and functioning as capacitive elements, as illustrated in FIG. 3.

In this manner, a "first capacitor" according to a preferred embodiment of the present invention connected in series in the first path W1 of the LC high pass filter 101 is defined by the first elastic wave resonators.

The LC low pass filter 102 includes a second input terminal A2 connected to the input terminal A of the band pass filter 100, the second output terminal B2 connected to the first input terminal A1 of the LC high pass filter 101, a plurality of second elastic wave resonators P4-P8 defined by the second electrodes provided on or in the second base board 4, second inductors L10-L13, attenuation characteristic adjustment capacitors C2-C5, and attenuation characteristic adjustment inductors L5-L9. Four of the second inductors are connected in series in a second path W2 connecting the second input terminal A2 and the second output terminal B2, and each of the second elastic wave resonators P4-P8 is connected between two of the serially-connected second inductors, and between the second path W2 and the ground potential.

The attenuation characteristic adjustment inductors L5-L9 are connected in series to the second elastic wave resonators P4-P8, respectively. Additionally, the attenuation characteristic adjustment capacitors C2-C5 are connected in parallel to the second inductors L10-L13, respectively. Furthermore, each second elastic wave resonator preferably has at least one of a resonant frequency and an anti-resonant frequency in a band APH near the border between the second stop band RB2 and the pass band PB, as illustrated in FIG. 3. By setting the resonant frequency or anti-resonant frequency of each of the plurality of second elastic wave resonators to a different value, a second attenuation pole group is able to be provided in the band APH. Providing the second attenuation pole group in this manner makes it possible to provide a band having desired attenuation characteristics in the second stop band RB2 near the pass band PB.

Meanwhile, as illustrated in FIG. 4, the second elastic wave resonators define and function as capacitive elements in bands on the high-frequency side of the anti-resonant frequencies thereof. As such, attenuation characteristics of a high-frequency signal in a band AH on the high-frequency side of the second attenuation pole group are set by the serially-connected second inductors L10-L13, the attenuation characteristic adjustment capacitors C2-C5, the attenuation characteristic adjustment inductors L5-L9, and the second elastic wave resonators P4-P8 defining and functioning as capacitive elements, as illustrated in FIG. 3.

In this manner, a "second capacitor" according to a preferred embodiment of the present invention, connected between the second path W2 of the LC low pass filter 102 and the ground potential, is defined by the second elastic wave resonators P4-P8.

Note that the configurations of the LC high pass filter 101 and the LC low pass filter 102 included in the band pass filter 100 are not limited to those illustrated in FIG. 2. For example, the band pass filter 100 may be defined using a typical LC high pass filter 201 and LC low pass filter 202 as illustrated in FIGS. 5 and 6.

Figure 5:
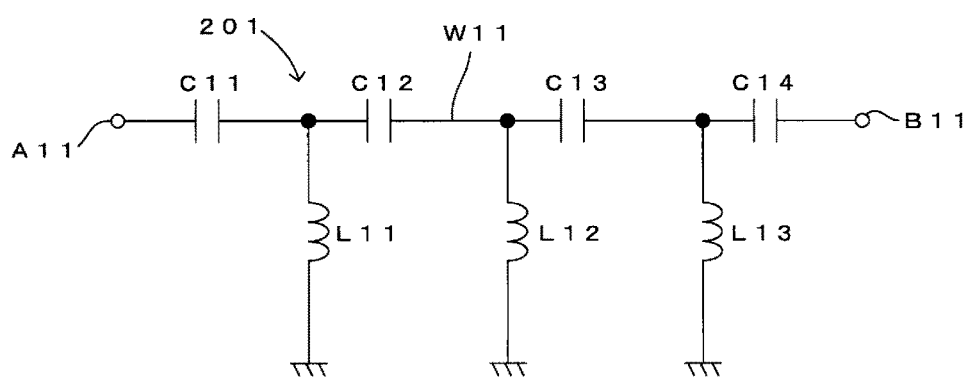
FIG. 5 is a circuit diagram illustrating an example of an LC high pass filter.

As illustrated in FIG. 5, the LC high pass filter 201 includes first capacitors C11-C14, connected in series in a first path W11 connecting a first input terminal A11 and a first output terminal B11, and first inductors L11-L13 connected between the first path W11 and a ground potential. Although not illustrated in FIG. 5, at least one first capacitor is provided (replaced) by a first elastic wave resonator. In the case where the elastic wave resonator is a surface acoustic wave resonator (SAW resonator) in which interdigital transducer electrodes are provided on a surface of a piezoelectric body, the elastic wave resonator is provided with capacitance such that an electrostatic capacitance value determined by the piezoelectric material, the distance between electrode fingers in a comb-tooth shaped electrode, a cross-width, and a number of pairs in the elastic wave resonator is equal to an electrostatic capacitance value of the capacitor. Alternatively, in the case where the elastic wave resonator is a bulk elastic wave resonator (BAW resonator) in which upper and lower electrodes are provided on mutually-opposite surfaces of a piezoelectric body, the BAW resonator is provided with capacitance such that an electrostatic capacitance value determined by the piezoelectric material, the opposing surface area of the upper and lower electrodes, and the distance between the electrodes in the elastic wave resonator is equal or substantially equal to an electrostatic capacitance value of the capacitor.

Figure 6:
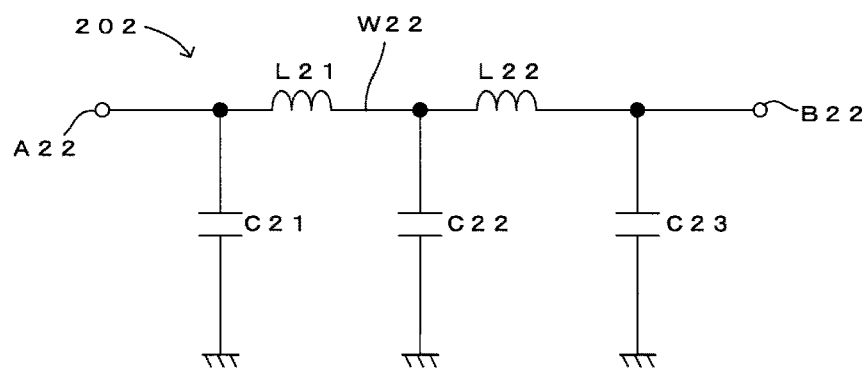
FIG. 6 is a circuit diagram illustrating an example of an LC low pass filter.

As illustrated in FIG. 6, the LC low pass filter 202 includes second inductors L21 and L22, connected in series in a second path W22 connecting a second input terminal A22 and a second output terminal B22, and second capacitors C21-C23 connected between the second path W22 and the ground potential. Although not illustrated in FIG. 6, at least one second capacitor is defined (replaced) by a second elastic wave resonator.

Note that attenuation characteristic adjustment capacitors and inductors may further be added to the LC high pass filter 201 and LC low pass filter 202 illustrated in FIGS. 5 and 6, in the same manner as the circuit illustrated in FIG. 2. In other words, attenuation characteristic adjustment capacitors or inductors may be added as desired to the LC high pass filter 201 and the LC low pass filter 202 illustrated in FIGS. 5 and 6 so as to change the circuit configurations thereof in order to adjust the attenuation characteristics of the basic LC high pass filter 201 and LC low pass filter 202, and as a result, the LC high pass filter 101 and the LC low pass filter 102 illustrated in FIG. 2 are provided.

Next, the first elastic wave resonators and the second elastic wave resonators will be described in detail. Note that in the following descriptions, when describing elements or features that the first elastic wave resonators and the second elastic wave resonators have in common, the first elastic wave resonators and the second elastic wave resonators may be referred to simply as "resonators".

The resonators are defined by SAW resonators using surface acoustic waves (SAW), by piezoelectric thin film resonators (Film Bulk Acoustic Resonators, or FBAR; Solidly Mounted Resonators, or SMR) using bulk acoustic waves (BAW), by resonators using boundary elastic waves, or the like.

A SAW resonator includes interdigital transducer (IDT) electrodes including a pair of comb tooth-shaped electrodes formed on a surface of a piezoelectric substrate made of quartz, lithium tantalate ($LiTaO_3$), lithium niobate ($LiNbO_3$), or the like. The frequency characteristics of the SAW resonator are able to be adjusted by changing the type of the substrate, including the material, cut-angles, and so on of the piezoelectric substrate, the direction in which the surface acoustic waves propagate, and so on, changing the electrode configuration such as the structure, film thickness, and so on of the comb tooth-shaped electrode, and the like. The piezoelectric thin film resonator is formed preferably by disposing a piezoelectric thin film sandwiched between an upper electrode and a lower electrode on the surface of an Si substrate or the like.

In this preferred embodiment, the first elastic wave resonators and the second elastic wave resonators each have significantly improved or optimal configurations according to the frequency characteristics thereof. In other words, the piezoelectric first base board 3 and the piezoelectric second base board 4 are combined to obtain configurations in which the material or electromechanical coupling coefficients differ from each other and in which the shapes of the first electrodes and the second electrodes differ from each other.

Specific examples of combinations of the first base board 3 and the second base board 4 having mutually different materials or electromechanical coupling coefficients, and specific examples of combinations of the first elastic wave resonators (first electrodes) and second elastic wave resonators (second electrodes), will be described next.

(1) Combination of Base Board Material (Material Properties) and Electrode Configuration (Resonator Type)

A. first elastic wave resonator significantly improved or optimized for first stop band RB1: SAW resonator second elastic wave resonator significantly improved or optimized for second stop band RB2: piezoelectric thin film resonator In combination A, a piezoelectric thin film resonator, which has steeper attenuation characteristics than a SAW resonator, is used on the high-frequency side, where fluctuations in attenuation characteristics have a greater effect. This makes it possible to obtain steep attenuation characteristics on the higher band side of the pass band of the band pass filter. Furthermore, a SAW resonator, which has a higher rate of surface area reduction in the resonator due to drops in resonant and anti-resonant frequencies than a piezoelectric thin film resonator, is used on the low-frequency side, where fluctuations in attenuation characteristics have a greater effect. This makes it possible to make the band pass filter smaller.

B. first elastic wave resonator significantly improved or optimized for first stop band RB1: SAW resonator second elastic wave resonator significantly improved or optimized for second stop band RB2: SMR-type BAW resonator In combination B, an SMR-type BAW resonator is used as a piezoelectric thin film resonator, and thus compared to an FBAR-type BAW resonator, a process for forming a cavity in which a sacrificial layer is formed can be omitted during manufacture, and furthermore, favorable frequency-temperature characteristics are obtained.

C. first base board 3 significantly improved or optimized for first stop band RB1: lithium tantalate piezoelectric substrate first elastic wave resonator: SAW resonator second base board 4 significantly improved or optimized for second stop band RB2: lithium niobate piezoelectric substrate second elastic wave resonator: SAW resonator In combination C, a SAW resonator on a lithium tantalate piezoelectric substrate is used on the low-frequency side, and a SAW resonator having a Rayleigh wave as a principal wave, on a lithium niobate piezoelectric substrate, which stabilizes changes in temperature characteristics by covering the interdigital transducer electrodes with $SiO_2$, is used on the high-frequency side where fluctuations in attenuation characteristics have a greater effect. Doing so provides highly-stable temperature characteristics, as well as steep attenuation characteristics on the higher band side of the pass band of the band pass filter. By using a SAW resonator on a lithium tantalate piezoelectric substrate, in which the effects of harmonic spurious from higher-order modes are comparatively low, on the low-frequency side, the effects of higher-order modes within the pass band of the band pass filter are able to be significantly reduced or prevented and the filter can be configured without consideration for the effects of higher-order modes. This increases the freedom with which the filter can be designed.

Figure 7:
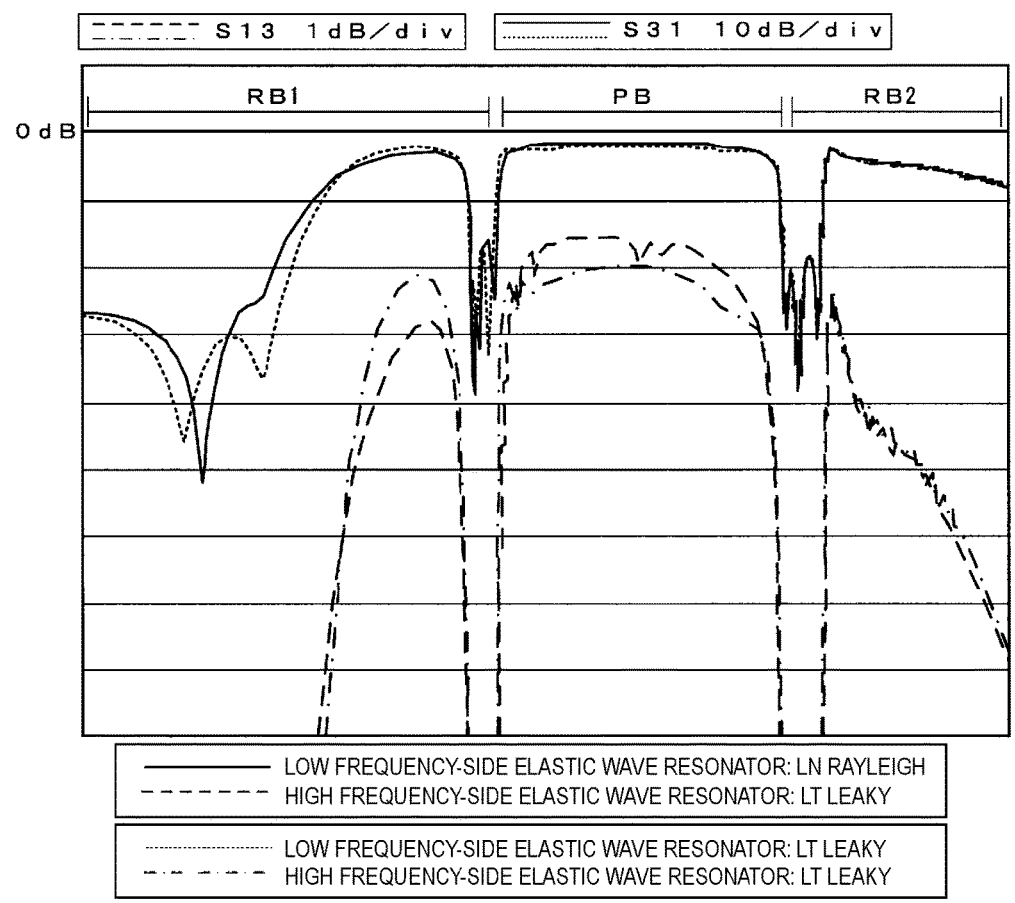
FIG. 7 is a diagram illustrating frequency characteristics of the band pass filter according to the first preferred embodiment of the present invention and of a comparative example.

D. first base board 3 significantly improved or optimized for first stop band RB1: lithium niobate piezoelectric substrate first elastic wave resonator: SAW resonator second base board 4 significantly improved or optimized for second stop band RB2: lithium tantalate piezoelectric substrate second elastic wave resonator: SAW resonator As one preferred embodiment of the present invention, in combination D, a SAW resonator having a Rayleigh wave as a principal wave, on a lithium niobate piezoelectric substrate, is used for the first elastic wave resonators provided connected to each other in series in the path connecting the input terminal and the output terminal in the LC low pass filter. A SAW resonator having a leaky elastic wave (leaky wave) as a principal wave, on a lithium niobate piezoelectric substrate, is used as the second elastic wave resonator on the higher-band side. A SAW resonator provided with interdigital transducer electrodes, having a leaky elastic wave (leaky wave) as a principal wave, on the same lithium niobate piezoelectric substrate as with the first and second elastic wave resonators, is used as a comparative example. The frequency characteristics of the preferred embodiment of the present invention and of the comparative example are indicated in FIG. 7. Compared to the comparative example, the preferred embodiment of the present invention, the first resonator on the lower-band side defines and functions as a capacitor having less loss caused by bulk radiation occurring on the higher-band side of the resonant frequency and a high Q value in the pass band on the higher-band side of the resonant frequency, and thus insertion loss in the pass band of the band pass filter is significantly reduced. Furthermore, by using, in the LC high pass filter, a SAW resonator on a lithium tantalate piezoelectric substrate, which is less brittle and less easily damaged than a lithium niobate piezoelectric substrate, as the higher-band side second elastic wave resonator provided in a path between a path connecting the input terminal to an output terminal and a ground potential, a band pass filter having a piezoelectric substrate that is damaged little during manufacture is able to be obtained.

(2) Combination of Base Board Shape (Manufacturing Method) and Electrode Shape (Electrode Structure, Electrode Film Thickness)

E. The cut-angles of the first base board 3 of the first elastic wave resonator defined by a SAW resonator significantly improved or optimized for the first stop band RB1 differ from the cut-angles of the second base board 4 of the second elastic wave resonator defined by a SAW resonator significantly improved or optimized for the second stop band RB2.

In combination E, for example, a SAW resonator having a Rayleigh wave as a principal wave, in which interdigital transducer electrodes including a Pt layer having a thickness of approximately 1.5% of the wave length and an Al layer having a thickness of approximately 7% of the wave length as electrode fingers are provided on a 127°-rotated Y-cut-X-propagating lithium niobate piezoelectric substrate, is used as the first elastic wave resonator on the lower-band side. Meanwhile, a SAW resonator having a leaky wave as a principal wave, in which interdigital transducer electrodes including a Pt layer having a thickness of approximately 2.5% of the wave length and an Al layer having a thickness of approximately 10% of the wave length as electrode fingers are provided on a −11°-rotated Y-cut-X-propagating lithium niobate piezoelectric substrate, is used as the second elastic wave resonator on the higher-band side. In this case, on the lower-band side, dependence on frequencies outside the pass band can be suppressed, and insertion loss within the pass band caused by the effects of bulk waves is significantly reduced. On the higher-band side, attenuation is ensured by a resonator having a low electrostatic capacitance due to the high electromechanical coupling coefficient, and thus insertion loss within the pass band is significantly reduced.

F. The electrode structure of the SAW resonator that defines the first elastic wave resonator significantly improved or optimized for the first stop band RB1 differs from the electrode structure of the SAW resonator that defines the second elastic wave resonator significantly improved or optimized for the second stop band RB2.

In combination F, for example, a SAW resonator having a leaky wave as a principal wave, in which interdigital transducer electrodes including a Pt layer having a thickness of approximately 1.5% of the wave length and an Al layer having a thickness of approximately 7% of the wave length as electrode fingers are provided on a 127°-rotated Y-cut-X-propagating lithium niobate piezoelectric substrate, is used as the first elastic wave resonator on the lower-band side. Meanwhile, a SAW resonator having a leaky wave as a principal wave, in which interdigital transducer electrodes including an Al layer having a thickness of approximately 10% of the wave length as electrode fingers are provided on a 64°-rotated Y-cut-X-propagating lithium niobate piezoelectric substrate, is used as the second elastic wave resonator on the higher-band side. In this case, if a SAW resonator that uses a Rayleigh wave as a principal wave and that has steep attenuation characteristics is used as the second elastic wave resonator on the higher-band side, the attenuation characteristics on the higher-band side of the pass band are steep, and a principal wave harmonic in the Rayleigh wave is able to be located in a stop band on the higher-band side outside the pass band of the band pass filter. This makes it possible to obtain a band pass filter in which the frequency characteristics outside the pass band fluctuate little.

G. The electrode film thickness of the SAW resonator that defines the first elastic wave resonator significantly improved or optimized for the first stop band RB1 differs from the electrode film thickness of the SAW resonator that defines the second elastic wave resonator significantly improved or optimized for the second stop band RB2.

In combination G, for example, a SAW resonator having a leaky wave as a principal wave, in which interdigital transducer electrodes including an Al layer having a thickness of approximately 11% of the wave length as electrode fingers are provided on a 42°-rotated Y-cut-X-propagating lithium tantalate piezoelectric substrate, is used as the first elastic wave resonator on the lower-band side. Meanwhile, a SAW resonator having a leaky wave as a principal wave and having steep attenuation characteristics, in which interdigital transducer electrodes including an Al layer having a thickness of approximately 7% of the wave length as electrode fingers are provided on a 42°-rotated Y-cut-X-propagating lithium tantalate piezoelectric substrate, is used as the second elastic wave resonator on the higher-band side. In this case, by using a resonator having thicker interdigital transducer electrodes and a comparatively low occurrence of bulk radiation as the first resonator on the lower-band side of the pass band, an increase in insertion loss in the pass band is able to be reduced. Making the interdigital transducer electrodes thinner and suppressing the occurrence of ripples caused by SH waves entering the pass band make it possible to obtain a band pass filter in which the frequency characteristics in the pass band fluctuate little on the higher-band side of the pass band.

Note that the combinations of materials and shapes of the first base board 3 and the second base board 4, and the combinations of shapes of the first elastic wave resonators (first electrodes) and the second elastic wave resonators (second electrodes), are not limited to the specific examples given above. For example, each of the first and second elastic wave resonators may be structured so as to have significantly improved or optimal configurations in accordance with the frequency characteristics thereof.

As described thus far, according to the preferred embodiment, the first attenuation pole is provided in the first stop band RB1 by the first elastic wave resonator, which has at least one of a resonant frequency and an anti-resonant frequency in the first stop band RB1 on the low-frequency side of the pass band PB, and thus steeper attenuation characteristics are able to be set on the low-frequency side of the band pass filter 100. Meanwhile, the second attenuation pole is provided in the second stop band RB2 by the second elastic wave resonator, which has at least one of a resonant frequency and an anti-resonant frequency in the second stop band RB2 on the high-frequency side of the pass band PB, and thus steeper attenuation characteristics are able to be set on the high-frequency side of the band pass filter 100.

Additionally, the materials or electromechanical coupling coefficients of the first base board 3 and the second base board 4 differ from each other, and the shapes of the first electrodes and the second electrodes differ from each other as well, and thus the following effects are able to be achieved. That is, the first elastic wave resonator is able to be provided with the type of the first base board 3 and the configuration of the first electrodes significantly improved or optimal for the frequency characteristics of the first elastic wave resonator, and the second elastic wave resonator is able to be provided with the type of the second base board 4 and the configuration of the second electrodes significantly improved or optimal for the frequency characteristics of the second elastic wave resonator.

Accordingly, the first attenuation pole provided by the first elastic wave resonator and the second attenuation pole provided by the second elastic wave resonator are able to be stepper than in a case where the first elastic wave resonator and the second elastic wave resonator, which have mutually-different frequency characteristics, have the same materials or electromechanical coupling coefficients and the same shapes for the first electrodes and the second electrodes in the first base board 3 and the second base board 4. Accordingly, the band pass filter 100, which further improves attenuation characteristics, is able to be provided.

In the case where an SMR-type BAW resonator or a piezoelectric thin film resonator is used on the higher-band side outside the pass band and a SAW resonator is used on the lower-band side outside the pass band, the filter is able to be smaller, and the attenuation characteristics are improved.

The temperature characteristics are improved in the case where a lithium niobate piezoelectric substrate on which are provided interdigital transducer electrodes covered by an $SiO_2$ dielectric layer is used for the second resonator having an attenuation pole on the higher-band side outside the pass band, and a lithium tantalate piezoelectric substrate is used on the lower-band side outside the pass band.

When the band pass filter includes only elastic wave resonators, there is a problem in that there is greater insertion loss in the pass band than with an LC filter using concentrated-constant inductors and capacitors. However, as described above, providing the band pass filter 100 by replacing some of the capacitors in the LC filter with elastic wave resonators makes it possible to improve both the bandpass characteristics (the insertion loss) and the attenuation characteristics.

Additionally, the band pass filter 100 is formed preferably by connecting the LC high pass filter 101 and the LC low pass filter 102 in series, and thus the pass band PB of the band pass filter 100 is able to be wider.

Additionally, the first attenuation pole is provided near the border between the first stop band RB1 and the pass band PB by the first elastic wave resonator of the LC high pass filter 101. The attenuation characteristics on the low-frequency side of the first attenuation pole are set by the first inductors and the first capacitors of the LC high pass filter 101, and thus degradation of the attenuation characteristics on the low-frequency side of the first attenuation pole is able to be significantly reduced or prevented.

Additionally, the second attenuation pole is provided near the border between the second stop band RB2 and the pass band PB by the second elastic wave resonator of the LC low pass filter 102. The attenuation characteristics on the high-frequency side of the second attenuation pole are set by the second inductors and the second capacitors of the LC low pass filter 102, and thus degradation of the attenuation characteristics on the high-frequency side of the second attenuation pole is able to be significantly reduced or prevented.

Accordingly, the filter module 1 including the band pass filter 100 in which the attenuation characteristics are improved is provided.

Incidentally, when a high-frequency signal at a resonant/anti-resonant frequency is inputted, the first elastic wave resonator and the second elastic wave resonator are excited to oscillation. When the power of the inputted high-frequency signal increases, the amplitude of the oscillation of the first elastic wave resonator and the second elastic wave resonator increases. As such, in a past elastic wave filter formed from elastic wave resonators having resonant/anti-resonant frequencies in the pass band PB, there is a risk of the electrodes of the elastic wave resonator being damaged by the amplitude of the oscillation increasing, and thus the power of the high-frequency signal in the pass band PB, inputted into the elastic wave filter, has been suppressed to a magnitude of approximately 1-2 W (approximately 30-33 dBm).

On the other hand, according to the above-described preferred embodiments, at least one of the resonant frequency and the anti-resonant frequency of the first elastic wave resonator is the first attenuation pole located within the first stop band RB1 on the low-frequency side of the pass band, and at least one of the resonant frequency and the anti-resonant frequency of the second elastic wave resonator is the second attenuation pole located within the second stop band RB2 on the high-frequency side of the pass band. As illustrated in FIG. 4, in frequencies lower than the resonant frequency and frequencies higher than the anti-resonant frequency, the first elastic wave resonator and the second elastic wave resonator are not excited to oscillation, and define and function as capacitive elements. Accordingly, compared to the past configuration, even if a high-power high-frequency signal is inputted in the pass band PB, oscillation of the first elastic wave resonator and the second elastic wave resonator is significantly reduced. This makes it possible to prevent the electrodes of the first elastic wave resonator and the second elastic wave resonator from being damaged. As such, input characteristics of the high-power high-frequency signal are able to be improved, and an electric power handling capability for input powers greater than or equal to, for example, approximately 5 W (approximately 37 dBm) is able to be improved.

Additionally, the following effects are able to be achieved by having at least one of the resonant frequency and the anti-resonant frequency of each first elastic wave resonator be the first attenuation pole located within the first stop band RB1 on the low-frequency side of the pass band and at least one of the resonant frequency and the anti-resonant frequency of each second elastic wave resonator be the second attenuation pole located within the second stop band RB2 on the high-frequency side of the pass band. That is, the anti-resonant frequency of each first elastic wave resonator provides an attenuation pole in the first stop band RB1 on the low-frequency side of the pass band PB. Accordingly, the resonant frequency is a lower frequency than the anti-resonant frequency, and thus the resonant frequency of each first elastic wave resonator does not overlap with the pass band PB.

Additionally, the resonant frequency of each second elastic wave resonator provides an attenuation pole in the second stop band RB2 on the high-frequency side of the pass band PB. Accordingly, the anti-resonant frequency is a higher frequency than the resonant frequency, and thus the anti-resonant frequency of each second elastic wave resonator does not overlap with the pass band PB. As such, the resonant/anti-resonant frequencies of the first elastic wave resonators and the second elastic wave resonators do not overlap with the pass band PB, which makes it possible to provide the band pass filter 100 capable of withstanding high-power input signals more effectively.

Second Preferred Embodiment

Figure 8:
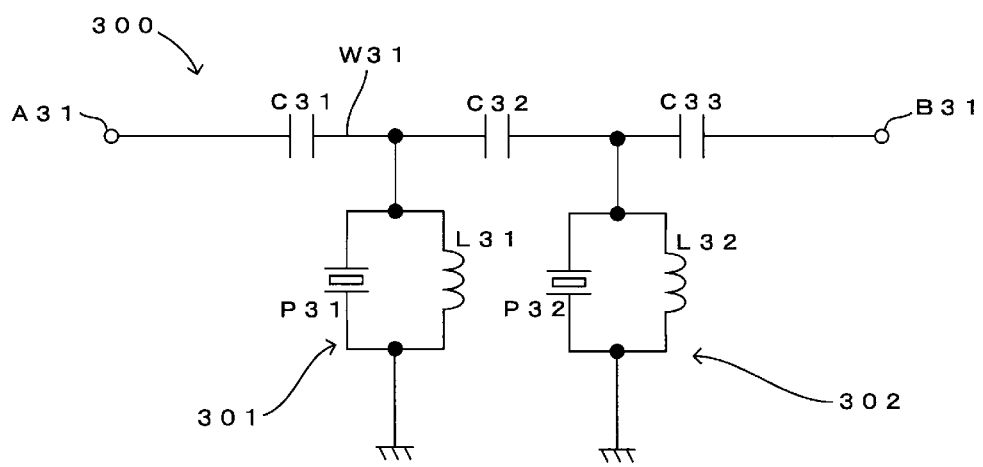
FIG. 8 is a circuit diagram illustrating a band pass filter according to a second preferred embodiment of the present invention.

A second preferred embodiment of the present invention will be described next with reference to FIG. 8. FIG. 8 is a circuit diagram illustrating a band pass filter according to the second preferred embodiment of the present invention. Note that configurations identical to those in the above-described first preferred embodiment will be given the same reference numerals, and descriptions of those configurations will be omitted.

As illustrated in FIG. 8, a band pass filter 300 according to this preferred embodiment includes third capacitors C31-C33 connected in series in a path W31 connecting an input terminal A31 and an output terminal B31, and two LC parallel resonance circuits 301 and 302 connected between the path W31 and a ground potential. Input and output capacitors may further be added to the input terminal A31 and the output terminal B31.

To provide the first attenuation pole in the first stop band RB1 on the low-frequency side, the LC parallel resonance circuit 301 includes a first elastic wave resonator P31 instead of a resonance circuit capacitor, and is thus provided by a resonance circuit inductor L31 and the first elastic wave resonator P31. To provide the second attenuation pole in the second stop band RB2 on the high-frequency side, the LC parallel resonance circuit 302 includes a second elastic wave resonator P32 instead of a resonance circuit capacitor, and is thus provided by a resonance circuit inductor L32 and the second elastic wave resonator P32.

By not connecting an elastic wave resonator in series to the path W31 connecting the input terminal A31 and the output terminal B31 in this manner, insertion loss is able to be reduced in the pass band PB.

Third Preferred Embodiment

Figure 9:
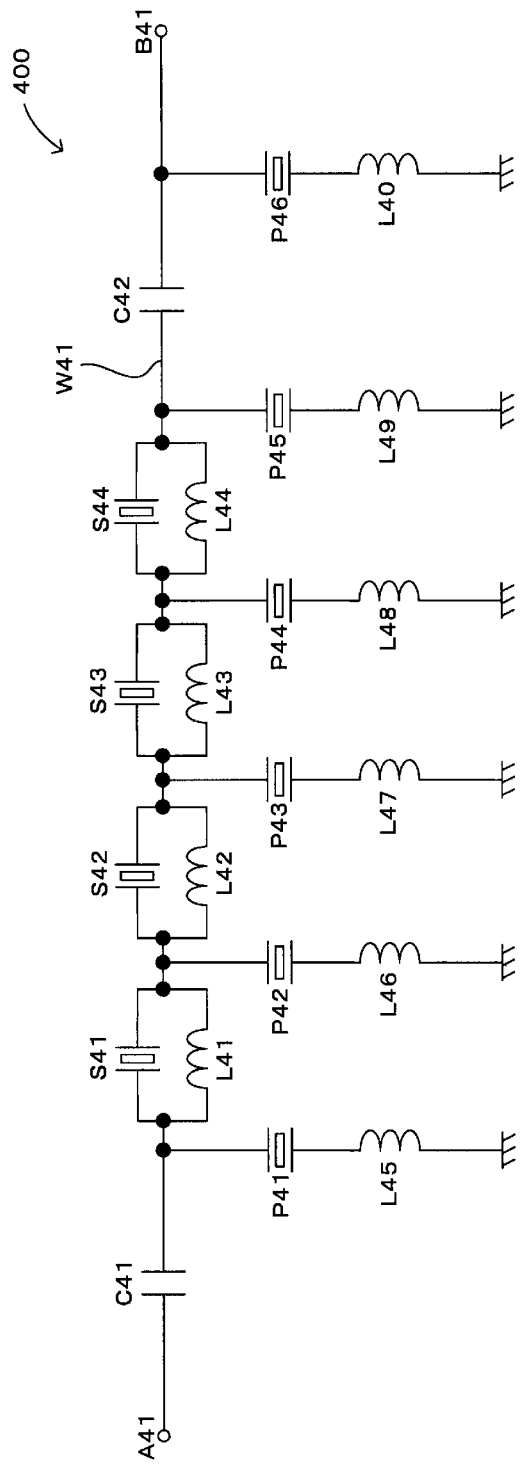
FIG. 9 is a circuit diagram illustrating a band pass filter according to a third preferred embodiment of the present invention.
Figure 10:
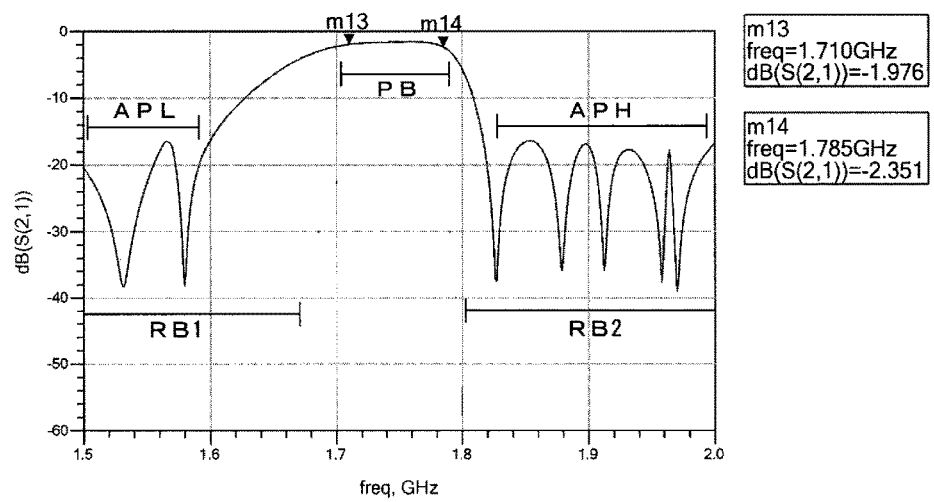
FIG. 10 is a diagram illustrating bandpass characteristics of the band pass filter illustrated in FIG. 9.
Figure 11:
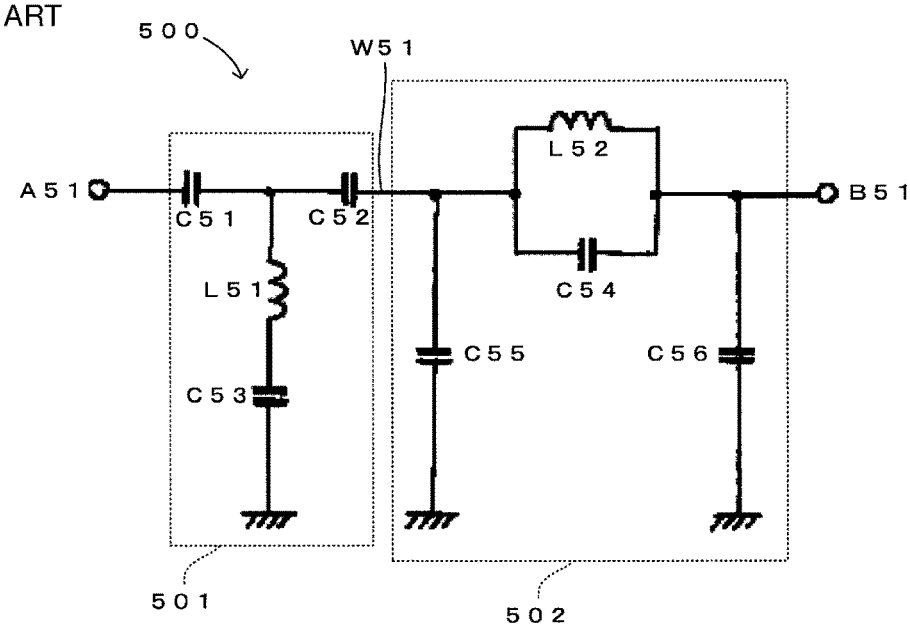
FIG. 11 is a diagram illustrating a past band pass filter.

A third preferred embodiment of the present invention will be described next with reference to FIGS. 9 and 10. FIG. 9 is a circuit diagram illustrating a band pass filter according to the third preferred embodiment of the present invention, and FIG. 10 is a diagram illustrating bandpass characteristics of the band pass filter illustrated in FIG. 9. Note that configurations identical to those in the above-described first preferred embodiment will be given the same reference numerals, and descriptions of those configurations will be omitted.

As illustrated in FIG. 9, a band pass filter 400 according to this preferred embodiment includes a plurality of first elastic wave resonators S41-S44 connected in series in a path W41 connecting an input terminal A41 and an output terminal B41, and a plurality of second elastic wave resonators P41-P46 connected between the path W41 and a ground potential. Characteristic adjustment inductors L41-L44 are connected in parallel to the first elastic wave resonators S41-S44, respectively, and characteristic adjustment inductor L45-L49 and L40 are connected in series to the second elastic wave resonators P41-P46, respectively. An input and output capacitor C41 is added to the input terminal A41. An input and output capacitor C42 is added to the output terminal B41.

Meanwhile, as illustrated in FIG. 10, each first elastic wave resonator in the serial arm has an anti-resonant frequency in the band APL near the border between the first stop band RB1 and the pass band PB. By setting the anti-resonant frequency of each of the plurality of first elastic wave resonators to a different value, a first attenuation pole group is able to be provided in the band APL, as illustrated in FIG. 3. Providing the first attenuation pole group in this manner makes it possible to provide a band having desired attenuation characteristics in the first stop band RB1 near the pass band PB.

Additionally, as illustrated in FIG. 10, each second elastic wave resonator in the parallel arms has a resonant frequency in the band APH near the border between the second stop band RB2 and the pass band PB. By setting the resonant frequency of each of the plurality of second elastic wave resonators to a different value, a second attenuation pole group is able to be provided in the band APH. Providing the second attenuation pole group in this manner makes it possible to provide a band having desired attenuation characteristics in the second stop band RB2 near the pass band PB.

As described above, the resonant/anti-resonant frequencies do not overlap with the pass band PB, and thus the durability with respect to high-power input signals in the pass band PB is able to be improved. Additionally, the first attenuation pole group near the low-frequency side of the pass band PB is provided by the anti-resonant frequencies of the first elastic wave resonators, and the second attenuation pole group near the high-frequency side of the pass band PB is provided by the resonant frequencies of the second elastic wave resonators, which makes it possible to provide the band pass filter 400 having excellent steepness.

Note that the present invention is not intended to be limited to the aforementioned preferred embodiments, and many variations aside from the content described above are able to be made without departing from the essential spirit of the present invention; furthermore, the configurations provided in the aforementioned preferred embodiments may be combined in any way. Additionally, the configuration of the band pass filter is not limited to the examples described above, and the band pass filter may be configured in any way as long as it is a band pass filter having a circuit configuration in which the first elastic wave resonators providing the first attenuation poles in the first stop band RB1 on the low-frequency side and the second elastic wave resonators providing the second attenuation poles in the second stop band RB2 on the high-frequency side are able to be used.

Additionally, in the band pass filter 300 illustrated in FIG. 8, at least one of the third capacitors C31-C33, the attenuation characteristic adjustment and input/output capacitors, and so on connected in series in the path W31 may be provided (replaced) by a first elastic wave resonator to provide the first attenuation pole in the first stop band RB1 on the low-frequency side. Additionally, an attenuation characteristic adjustment inductor may further be connected in series in the path W31.

The first base board 3 and the second base board 4 may be provided with what is known as a wafer level—chip size package (WL-CSP) structure, may be provided with chip size package (CSP) structures in which the first and second base boards 3 and 4 on which the resonators are provided are mounted on a package board.

Additionally, it is preferable that the first elastic wave resonators providing the first attenuation poles in the first stop band RB1 on the low-frequency side of the pass band PB be connected in series only in the path connecting the input terminal and the output terminal, and that the second elastic wave resonators providing the second attenuation poles in the second stop band RB2 on the high-frequency side of the pass band PB be connected only between a ground potential and the path connecting the input terminal and the output terminal. Doing so makes it possible to even more effectively improve the input power characteristics.

Preferred embodiments of the present invention are able to be broadly applied in band pass filters in which a predetermined pass band is set and in filter modules including such filters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band pass filter comprising:
   an LC high pass filter including a first input terminal, a first output terminal, a first path connecting the first input terminal and the first output terminal, a first elastic wave resonator and a first capacitor connected in series in the first path, and a first inductor connected between the first path and a ground potential;
   an LC low pass filter including a second input terminal, a second output terminal, a second path connecting the second input terminal and the second output terminal, a second elastic wave resonator and a second capacitor connected between the second path and a ground potential, and a second inductor connected in series in the second path; wherein the LC high pass filter and the LC low pass filter are connected in series;

the first elastic wave resonator includes a first electrode and a piezoelectric first base board in or on which the first electrode is provided;

the second elastic wave resonator includes a second electrode and a piezoelectric second base board in or on which the second electrode is provided; and a type of the first base board and a type of the second base board are different from each other, and/or a configuration of the first electrode and a configuration of the second electrode are different from each other.

2. The band pass filter according to claim 1, wherein the first base board and the second base board are made of mutually-different materials.

3. The band pass filter according to claim 1, wherein the first base board and the second base board have electromechanical coupling coefficients.

4. The band pass filter according to claim 1, wherein the first electrode and the second electrode have mutually-different shapes.

5. The band pass filter according to claim 1, wherein
the LC high pass filter includes a first stop band;
the LC low pass filter includes a second stop band;
attenuation characteristics on a low-frequency side of a first attenuation pole of the first stop band are set by the first inductor and the first capacitor; and
attenuation characteristics on a high-frequency side of a second attenuation pole of the second stop band are set by the second inductor and the second capacitor.

6. The band pass filter according to claim 5, wherein the LC high pass filter includes:

a plurality of the first capacitors connected in series in the first path connecting the first input terminal and the first output terminal; wherein at least one of the plurality of first capacitors is defined by capacitance of the first elastic wave resonator on a lower-band side of the resonant frequency of the first elastic wave resonator and a higher-band side of the anti-resonant frequency of the first elastic wave resonator.

7. The band pass filter according to claim 5, wherein the LC low pass filter includes:

a plurality of the second inductors connected in series in the second path connecting the second input terminal and the second output terminal; wherein the second capacitor includes a plurality of second capacitors; and at least one of the plurality of second capacitors is defined by capacitance of the second elastic wave resonator on a lower-band side of the resonant frequency of the second elastic wave resonator and a higher-band side of the anti-resonant frequency of the second elastic wave resonator.

8. The band pass filter according to claim 1, further comprising:
an input terminal;
an output terminal;
a plurality of the first elastic wave resonators connected in series in a path connecting the input terminal and the output terminal; and a plurality of the second elastic wave resonators connected between the path and a ground potential.

9. The band pass filter according to claim 1, wherein the first elastic wave resonator is a surface acoustic wave resonator and the second elastic wave resonator is a piezoelectric thin film resonator or an solidly-mounted resonator bulk acoustic wave resonator.

10. The band pass filter according to of claim 1, wherein the first elastic wave resonator is a surface acoustic wave resonator, the second elastic wave resonator is a surface acoustic wave resonator, the first base board is a lithium tantalate piezoelectric substrate, and the second base board is a lithium niobate piezoelectric substrate.

11. The band pass filter according to claim 1, wherein the first elastic wave resonator is a surface acoustic wave resonator, the second elastic wave resonator is a surface acoustic wave resonator, and cut-angles of the first base board differ from cut-angles of the second base board.

12. The band pass filter according to claim 1, wherein the first elastic wave resonator is a surface acoustic wave resonator, the second elastic wave resonator is a surface acoustic wave resonator, and an electrode structure of the surface acoustic wave resonator defining the first elastic wave resonator differs from an electrode structure of the surface acoustic wave resonator defining the second elastic wave resonator.

13. The band pass filter according to claim 1, wherein the first elastic wave resonator is a surface acoustic wave resonator, the second elastic wave resonator is a surface acoustic wave resonator, and an electrode film thickness of the surface acoustic wave resonator defining the first elastic wave resonator differs from an electrode film thickness of the surface acoustic wave resonator defining the second elastic wave resonator.

14. A filter module comprising:
the band pass filter according to claim 1; and
a module board on which the first base board and the second base board are mounted.

15. A front end module comprising the filter module of claim 14.

16. A mobile communication terminal comprising the front end module according to claim 15.

17. The mobile communication terminal according to claim 16, wherein the mobile communication terminal is one of a mobile phone and a mobile information terminal.

18. A band pass filter including a predetermined pass band, the band pass filter comprising:
an LC filter including an inductor and a capacitor;
a first elastic wave resonator including a resonant frequency and an anti-resonant frequency;
a second elastic wave resonator including a resonant frequency and an anti-resonant frequency;
an input terminal;
an output terminal; and
a plurality of third capacitors connected in series in a path connecting the input terminal and the output terminal, and an LC parallel resonance circuit connected between the path and a ground potential; wherein
at least one of the resonant frequency and the anti-resonant frequency of the first elastic wave resonator is a first attenuation pole located within a first stop band on a low-frequency side of the pass band;
at least one of the resonant frequency and the anti-resonant frequency of the second elastic wave resonator is a second attenuation pole located within a second stop band on a high-frequency side of the pass band;

the first elastic wave resonator includes a first electrode and a piezoelectric first base board in or on which the first electrode is provided;

the second elastic wave resonator includes a second electrode and a piezoelectric second base board in or on which the second electrode is provided;

a type of the first base board and a type of the second base board are different from each other, and/or a configuration of the first electrode and a configuration of the second electrode are different from each other; and at least one of the third capacitors is defined by capacitance of the first elastic wave resonator, or at least one of resonance circuit capacitors that define the LC parallel resonance circuit are defined by capacitance of the first elastic wave resonator or the second elastic wave resonator.

19. The band pass filter according to claim 18, wherein the first elastic wave resonator and the second elastic wave resonator are not connected in series in the path.

20. The band pass filter according to claim 19, wherein the anti-resonant frequency of the first elastic wave resonator is the first attenuation pole; and the resonant frequency of the second elastic wave resonator is the second attenuation pole.

* * * * *